May 29, 1962 F. D. ROSI ET AL 3,037,064
METHOD AND MATERIALS FOR OBTAINING LOW RESISTANCE BONDS TO THERMOELECTRIC BODIES
Filed Dec. 12, 1960
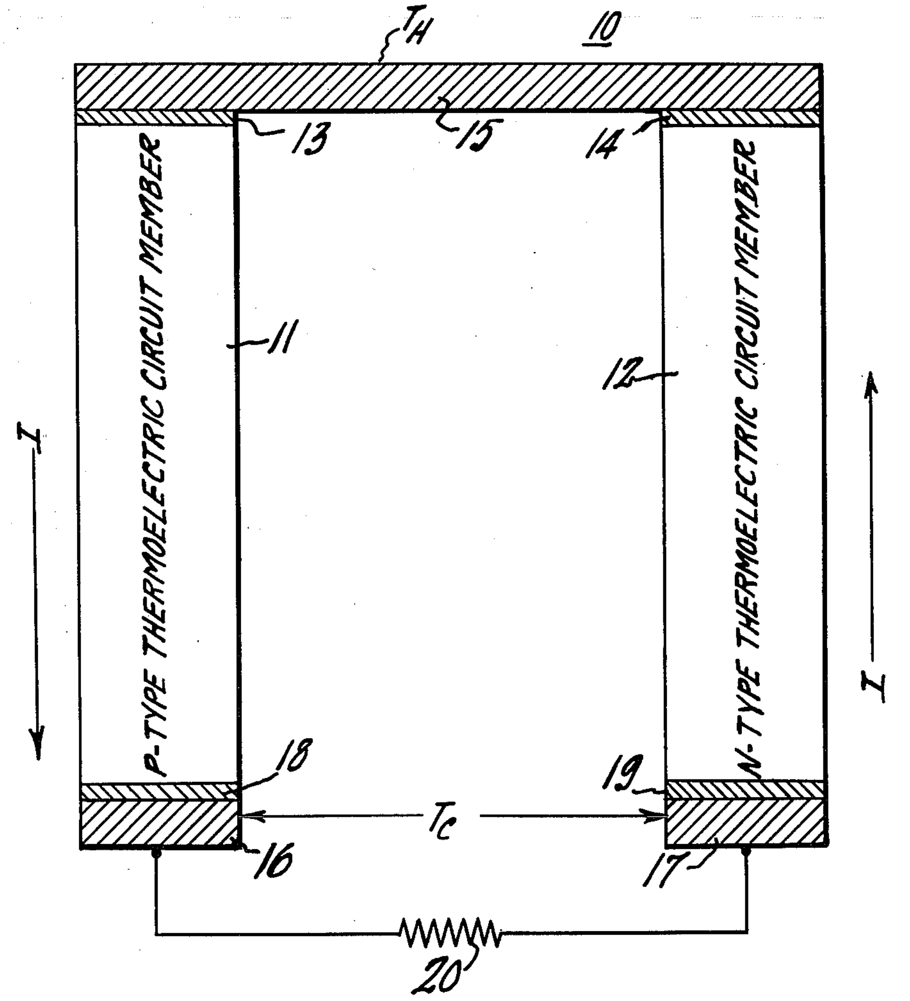
INVENTORS.
FRED D. ROSI
& ROBERT A. BERNOFF
BY W. S. Hill
AGENT 3,037,064

METHOD AND MATERIALS FOR OBTAINING LOW RESISTANCE BONDS TO THERMOELECTRIC BODIES

Fred D. Rosi, Plainsboro, N.J., and Robert A. Bernoff, Elkins Park, Pa., assignors to Radio Corporation of America, a corporation of Delaware Filed Dec. 12, 1960, Ser. No. 75,239
14 Claims. (Cl. 136—5)

This invention relates to improved thermoelectric devices and to improved methods of fabricating such devices. More particularly, the invention relates to improved materials and methods for obtaining low electrical resistance bonds to thermoelectric components.

Thermoelectric materials include compound semiconductors such as bismuth telluride, lead telluride, antimony telluride, silver antimony telluride, and the like. The selenides of antimony, bismuth and lead are similarly useful in thermoelectric devices. While the pure compounds may be utilized, thermoelectric compositions usually consist of alloys or solid solutions of these materials. These thermoelectric compositions generally include at least one element selected from the group consisting of bismuth, antimony, tellurium and selenium. Small amounts of various additives or doping agents may be incorporated in the thermoelectric composition to modify the conductivity type of the material.

Thermoelectric devices which convert heat energy directly into electrical energy by means of the Seebeck effect generally comprise two thermoelectric circuit members or components bonded to a block of metal, which may, for example, be copper, to form thermoelectric junctions. The two members are of thermoelectrically complementary types, that is, one member is made of P-type thermoelectric material and the other of N-type thermoelectric material. A good thermoelectric material should have a low electrical resistivity, since the Seebeck EMF generated in devices of this type is dependent upon the temperature difference between the hot and cold junctions. The generation of Joulean heat in the thermoelectric device due to the electrical resistance of either the thermoelectric members, or the auxiliary components, or the electrical contacts to the two members, will reduce the efficiency of the device.

Whether a thermoelectric material is designated N-type or P-type depends upon the direction of current flow across the cold junction of a thermocouple formed by the thermoelectric materials and a metal such as copper or lead, when the thermocouple is operating as a thermoelectric generator according to the Seebeck effect. If the current direction in the external circuit is positive toward the thermoelectric material, then the material is designated as "P-type"; if the current direction in the external circuit is negative toward the thermoelectric material, then the material is designated as "N-type." The present invention relates to both P-type and N-type thermoelectric materials generally.

Thermoelectric devices which utilize electrical energy for environmental cooling and refrigeration by means of the Peltier effect also include two thermoelectrically complementary circuit members bonded to a block of metal. In these devices, a typical thermoelectric junction uses 30 amperes at .1 volt. Accordingly, if any high resistance contacts are present, considerable Joulean heat will be dissipated, and the efficiency of the device will be decreased. The presence of high resistance contacts on the thermoelectric circuit members has been a serious problem in the fabrication of both Seebeck and Peltier thermoelectric devices. For example, a contact resistance of only one fourth the sum of the branch resistances (the resistances of the two circuit members) can still reduce the amount of Peltier cooling by as much as 25%. For the effect of contact resistance on maximum cooling obtained in Peltier devices, see FIG. 5 of chapter 8, "Evaluation and Properties of Materials for Thermoelectric Applications," by F. D. Rosi and E. G. Ramberg, in "Thermoelectricity," edited by P. H. Egli, John Wiley and Sons, Inc., New York, 1960.

It is therefore an object of the instant invention to provide improved methods and materials for making low resistance electrical contacts to thermoelectric circuit members.

Another object of the invention is to provide improved methods and materials for obtaining low resistance, mechanically strong electrical connections to thermoelectric components.

A further object of the invention is to provide improved methods and materials for obtaining low resistance, mechanically strong electrical bonds between a metal body and a thermoelectric circuit member.

Still another object of the invention is to provide improved electrical connections to thermoelectric components in thermoelectric devices.

Yet another object of the invention is to provide a low resistance electrical connection between a metal body and a thermoelectric component which is composed of an alloy including at least one element selected from the group consisting of bismuth, antimony, tellurium and selenium.

These and other objects and advantages of the instant invention are accomplished by applying to the surface of a thermoelectric body a solder consisting essentially of antimony and at least one metal selected from the group consisting of silver and gold. The preferred compositions of this group are those comprising from 30 to 68 atomic percent antimony, balance at least one metal selected from the group consisting of silver and gold. The thermoelectric circuit element or component is advantageously fluxed and then "tinned" with the aforesaid solder, preferably at a temperature between 485° C. and 550° C. for the silver-antimony alloys, and 360° C. to 460° C. for the gold-antimony alloys. The metal body to be joined to the thermoelectric component is also fluxed and "tinned" with the same solder. The "tinned" surfaces of the thermoelectric component and the metal body are pressed together, and the assemblage is heated at a temperature above the melting point of the solder, and preferably at a temperature in the range 360° to 485° C. The assemblage of the thermoelectric component and the metal body is then cooled to room temperature.

The invention will be described in greater detail by the following examples, in conjunction with the accompanying drawing, in which the sole FIGURE is a cross-sectional view of a thermoelectric device comprising two thermoelectrically complementary circuit elements bonded to a metal block in accordance with the invention.

Referring to the drawing, the thermoelectric device 10 for the conversion of thermal energy into electrical energy by utilizing the Seebeck effect comprises a P-type circuit member or thermoelement 11, and an N-type circuit member or thermoelement 12. The two circuit members 11 and 12 are conductively joined at one end of each to metal plate 15 by means of solder layers 13 and 14, respectively. The metal plate 15 may consist, for instance, of copper. The other ends of each of thermoelements 11 and 12 are bonded to electrical contacts 16 and 17 respectively by means of solder layers 18 and 19, respectively. Contacts 16 and 17 may be, for instance, copper blocks. The two circuit members 11 and 12 are advantageously formed of thermoelectric compositions which include at least one element of the group consisting of bismuth, antimony, tellurium and selenium.

In the operation of the device 10, the metal plate 15 and its junctions to the thermoelectric members 11 and 12 is heated to a temperature $T_H$ and becomes the hot junction of the device. The metal contacts 16 and 17 on thermoelements 11 and 12, respectively, are maintained at a temperature $T_C$ which is lower than the temperature ($T_H$) of the hot junction of the device. The lower or cold junction temperature ($T_C$) may, for example, be room temperature. A temperature gradient is thus established in each circuit member 11 and 12, from a high temperature adjacent plate 15 to a low temperature adjacent contacts 16 and 17, respectively. The electromotive force developed under these conditions produces in the external circuit a flow of (conventional) current (I) in the direction shown by arrows in the figure; that is, the current flows in the external circuit from the P-type thermoelement 11 toward the N-type thermoelement 12. The device is utilized by connecting a load, shown as a resistance 20 in the drawing, between the contacts 16 and 17 of thermoelements 11 and 12, respectively.

*Example I*

According to one aspect of the invention, a low electrical resistance contact is made to a thermoelectric body, such as thermoelectric circuit members 11 and 12 in this example, by "tinning" at least a portion of the thermoelectric body with a molten alloy consisting of 30 to 68 atomic percent antimony, balance silver. In this example, the specific composition utilized as the solder consists of 45 atomic percent antimony, and balance (55 atomic percent) silver. The solders of the invention are readily prepared by melting together appropriate weights of the constituent elements. In this example, the antimony-silver solder was prepared by melting together 54.79 grams antimony and 59.33 grams silver.

A low electrical resistance bond between a thermoelectric body such as thermoelement 11 and a metal block such as copper plate 15 is attained according to the invention as follows: The end of the thermoelectric body to be joined to the metal block is first given a finely-roughened or matte surface. A convenient method for achieving this is by vapor blasting the surface with a very fine suspended abrasive such as pumice. Other techniques such as rubbing with emery paper may also be employed to abrade the surface of the thermoelement. Thereafter, the abraded surface is fluxed with a saturated solution of lithium chloride or zinc chloride in methyl alcohol. Advantageously, the lithium chloride flux is utilized with P-type thermoelements, such as circuit member 11 in the example; and the zinc chloride flux is utilized on N-type thermoelements, such as circuit member 12 in this example. In this example, circuit member 11 is made of a P-type alloy of 60 mol percent Te, 20 mol percent Bi, 20 mol percent Sb, 0.28 weight percent Ag, and 0.56 weight percent Se, as described in U.S. Patent 2,762,857, issued September 11, 1956, to N. E. Lindenblad, and assigned to the same assignee as that of the instant application. Circuit member 12 is made of an N-type alloy of bismuth telluride and 5 to 40 mol percent bismuth selenide with .13 to .34 weight percent copper sulfide or silver sulfide, as described in U.S. Patent 2,902,528, issued to F. D. Rosi on September 1, 1959, and assigned to the same assignee as that of the instant application.

The next step is to "tin" the fluxed surface of the thermoelement by means of the antimony-silver solder. While solders containing from 30 to 68 atomic percent antimony have been found satisfactory for this purpose, it has been found that compositions within 10 percent of the antimony-silver eutectic are particularly advantageous for this purpose. The composition of this example, containing 45 atomic percent antimony and 55 atomic percent silver, has been found particularly satisfactory.

It is convenient to apply the flux to the thermoelectric body by brushing, and then dipping the fluxed end of the thermoelectric body in a pot containing the molten solder. The temperature of the solder is maintained in the range of 490° C. to 520° C.

The next operation is to flux and "tin" the metal block (copper plate 15 in this example) at the site where the metal block and the thermoelectric body are to be joined. It will be understood that in practice the fluxing and tinning operations of both the thermoelectric circuit element and the metal block may be performed simultaneously, so that the final steps in bonding them together may be carried out without interruption or delay. The metal block may be fluxed with the same fluxes that were employed for the thermoelectric circuit member or by other suitable fluxes. In this example, since the metal block consists of copper, any of the known copper fluxes may be utilized. Suitable fluxes for coper are zinc chloride or ammonium chloride. In this example, the copper plate 15 is fluxed, as by brushing, and then "tinned" by dipping the fluxed surface in the molten solder consisting of 45 atomic percent antimony—55 atomic percent silver.

The copper plate 15 is maintained at a temperature substantially above the melting point of the antimony-silver solder utilized, and preferably at a temperature of about 500° C. The "tinned" surface of the thermoelectric circuit member 11 is pressed into intimate contact against the "tinned" surface of the copper plate 15. The assemblage is then cooled. This may be accomplished by furnace cooling, or by a blast of cold air.

The process described above leaves a thin layer 13 of the antimony-silver solder intimately and strongly bonding the copper plate 15 and the thermoelectric circuit member 11. The 45 atomic percent antimony—55 atomic percent silver solder utilized in this embodiment has a specific resistance of $8.14 \times 10^{-5}$ ohm-cm. This composition has been utilized to join thermoelectric bodies to metal blocks, or make electrical contacts to thermoelectric bodies, with a junction resistance as low as $2 \times 10^{-4}$ ohm. Junctions made according to the invention are mechanically strong, and have exhibited stability as to electrical properties at temperatures up to 400° C.

It will be readily understood that the N-type circuit member 12 can be bonded to copper plate 15 by means of a thin layer 10 of antimony-silver solder in the same manner, and indeed thermoelement 12 may be joined to copper plate 15 during the same heating cycle utilized to bond thermoelement 11 to plate 15. Similarly, and even simultaneously, copper contacts 16 and 17 may be bonded to thermoelements 11 and 12, respectively in the same manner by means of solder layers 17 and 18, respectively.

*Example II*

According to another aspect of the invention, a low electrical resistance contact is made to a thermoelectric body, such as circuit members 11 and 12 in the drawing, by "tinning" at least a portion of the thermoelectric body with a molten alloy consisting of 30 to 68 atomic percent antimony, balance gold. In this example, the specific composition utilized consists of 35 atomic percent antimony, and the balance (65 atomic percent) gold. The solders of this embodiment are readily prepared by melting together appropriate weights of antimony and gold. In this example, the antimony-gold solder was prepared by melting together 42.6 grams antimony and 128 grams gold.

The P-type circuit member 11 in this example may consist of the same composition as described in Example I above, or may be made of other P-type thermoelectric compositions, for example silver antimony telluride $AgSbTe_2$. The N-type circuit member 12 in this example may be of the same composition as described in Example I above, or may be made of other N-type thermoelectric materials such as lead telluride.

The antimony-gold solders of this embodiment are utilized to form a low electrical resistance bond between a thermoelement and a metal block in the same manner as that described above in Example I. While all the antimony-gold alloys containing 30 to 68 atomic percent antimony have been found useful, the compositions within 10% of the antimony-gold eutectic have been found particularly advantageous. The 35 atomic percent antimony—65 atomic percent gold solder utilized in this embodiment has a specific resistance of less than $1\times10^{-4}$ ohm-cm. It has been used to join thermoelectric circuit members to metal blocks, or to make low resistance electrical contacts to thermoelectric bodies, with a junction resistance at least as low as an order of magnitude less than the sum of the branch resistances. Junctions made according to this embodiment of the invention are mechanically strong, and have exhibited stability as to electrical properties at temperatures up to 400° C.

It will be understood that various modifications may be made within the spirit and scope of the instant invention. For example, solders suitable for thermoelectric bodies may be prepared consisting of 30 to 68 atomic percent antimony, with the balance (70 to 32 atomic percent) consisting of a mixture of both silver and gold. A solder consisting of 40 atomic percent antimony, 30 atomic percent silver, and 30 atomic percent gold may be utilized on thermoelectric circuit members in the same manner as described in Examples I and II above. The range of temperatures available as melting points for the different solders may thus be extended without departing from the spirit and scope of the instant invention.

What is claimed is:

1. The method of providing a thermoelectric body with a low electrical resistance contact comprising tinning at least the portion of said body where the contact is to be made with a molten alloy consisting essentially of antimony and at least one metal selected from the group consisting of silver and gold.

2. The method of providing a thermoelectric body with a low electrical resistance contact comprising tinning at least the portion of said body where the contact is to be made with a molten alloy consisting essentially of 30 to 68 atomic percent antimony, balance at least one metal selected from the group consisting of silver and gold.

3. The method according to claim 2, wherein said body includes at least one element selected from the group consisting of bismuth, antimony, tellurium and selenium.

4. The method according to claim 2, wherein said alloy consists of 30 to 68 atomic percent antimony, balance silver.

5. The method according to claim 2, wherein said alloy consists of 30 to 68 atomic percent antimony, balance gold.

6. The method according to claim 2, wherein said alloy consists of 45 atomic percent antimony, balance silver.

7. The method according to claim 2, wherein said alloy consists of 35 atomic percent antimony, balance gold.

8. The method of soldering a metal body to a thermoelectric body so as to achieve a low electrical resistance bond therebetween, comprising the steps of tinning at least the portion of the surface of said thermoelectric body where the contact is to be made with a solder consisting essentially of 30 to 68 atomic percent antimony, balance at least one metal selected from the group consisting of silver and gold; tinning at least a portion of the surface of said metal body with said solder; contacting said tinned surfaces of said bodies while maintaining the temperature of said bodies above the melting point of said solder; and cooling said bodies.

9. The method according to claim 8, wherein said thermoelectric body includes at least one element selected from the group consisting of bismuth, antimony, tellurium and selenium.

10. The method as in claim 8, wherein said solder consists of 45 atomic percent antimony, balance silver.

11. The method as in claim 8, wherein said solder consists of 35 atomic percent antimony, balance gold.

12. A thermoelectric device including a thermoelement having a low electrical resistance contact bonded thereto, said contact consisting essentially of 30 to 68 atomic percent antimony, balance at least one metal selected from the group consisting of silver and gold.

13. A thermoelectric device including a thermoelement having a low electrical resistance contact bonded thereto, said contact consisting essentially of 45 atomic percent antimony, balance silver.

14. A thermoelectric device including a thermoelement having a low electrical resistance contact bonded thereto, said contact consisting essentially of 35 atomic percent antimony, balance gold.

References Cited in the file of this patent

UNITED STATES PATENTS

| | | |
|---|---|---|
| 2,793,243 | Lindenblad | May 21, 1957 |
| 2,877,283 | Justi | Mar. 10, 1959 |
| 2,952,725 | Evans et al. | Sept. 13, 1960 |

OTHER REFERENCES

RCA, Technical Note, No. 366, June 1960.

ASTIA, AD 241247, Report Date August 10, 1959, page 35.